(12) United States Patent
Ring et al.

(10) Patent No.: US 7,366,575 B2
(45) Date of Patent: Apr. 29, 2008

(54) WAFER POLISHING CONTROL

(75) Inventors: Matthew A. Ring, Aloha, OR (US); Scot Goerutiz, Phoenix, AZ (US); Kimberly A. Ryglelski, Gilbert, AZ (US); Anju Narendra, Beaverton, OR (US); Kevin E. Heldrich, Beaverton, OR (US); Brook D. Ferney, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 96 days.

(21) Appl. No.: 11/322,476

(22) Filed: Dec. 30, 2005

(65) Prior Publication Data

US 2007/0155284 A1     Jul. 5, 2007

(51) Int. Cl.
   *G05B 13/02*    (2006.01)
   *G06F 19/00*    (2006.01)

(52) U.S. Cl. .......................... 700/45; 438/959
(58) Field of Classification Search ............ 700/28, 700/32–34, 44–46, 96, 108–110, 117–121; 451/5–10, 28, 66, 287; 438/5–14, 16, 626, 438/631–633, 689–692, 959
See application file for complete search history.

(56) References Cited

U.S. PATENT DOCUMENTS

| | | | | |
|---|---|---|---|---|
| 5,816,891 | A * | 10/1998 | Woo | 451/6 |
| 6,230,069 | B1 * | 5/2001 | Campbell et al. | 700/121 |
| 6,540,591 | B1 * | 4/2003 | Pasadyn et al. | 451/41 |
| 6,587,744 | B1 * | 7/2003 | Stoddard et al. | 700/121 |
| 6,660,637 | B2 * | 12/2003 | Delage et al. | 438/692 |
| 6,884,147 | B2 * | 4/2005 | Toprac | 451/5 |
| 6,910,947 | B2 * | 6/2005 | Paik | 451/21 |
| 6,978,189 | B1 * | 12/2005 | Bode et al. | 700/121 |
| 6,984,168 | B1 * | 1/2006 | Melvin et al. | 451/285 |
| 7,001,243 | B1 * | 2/2006 | Yi et al. | 451/5 |
| 7,004,814 | B2 * | 2/2006 | Chen et al. | 451/5 |
| 7,029,381 | B2 * | 4/2006 | Melvin et al. | 451/285 |
| 7,083,495 | B2 * | 8/2006 | Lin et al. | 451/5 |
| 7,101,799 | B2 * | 9/2006 | Paik | 438/692 |
| 7,118,451 | B2 * | 10/2006 | Chen et al. | 451/8 |
| 7,158,851 | B2 * | 1/2007 | Funk | 700/121 |
| 7,160,739 | B2 * | 1/2007 | Shanmugasundram et al. | 438/14 |
| 7,195,535 | B1 * | 3/2007 | Swedek et al. | 451/5 |
| 7,223,690 | B2 * | 5/2007 | Kondo et al. | 438/637 |
| 7,259,097 | B2 * | 8/2007 | Yeh et al. | 438/692 |
| 7,292,906 | B2 * | 11/2007 | Funk et al. | 700/121 |
| 7,294,043 | B2 * | 11/2007 | Chen et al. | 451/41 |
| 2002/0137448 | A1 * | 9/2002 | Suh et al. | 451/398 |

OTHER PUBLICATIONS

Applied Materials, "Process Area", *CMP Manual*, (Sep. 25, 2002), 19 pages.
Applied Materials, "Water Processing Overview", *CMP Manual Introduction*, (Sep. 25, 2002), 16 pages.

* cited by examiner

*Primary Examiner*—M. N. Von Buhr
(74) *Attorney, Agent, or Firm*—Blakely, Sokoloff, Taylor & Zafman LLP

(57) ABSTRACT

Methods of controlling polishing of wafers are disclosed. In one aspect, a method may include measuring one or more pre-polish thicknesses of one or more layers of a wafer. The one or more layers may then be polished. Then a post-polish thickness of a layer of the wafer may be measured. Polishing may be controlled by using feed-forward control with the one or more pre-polish thicknesses and by using feed-back control with the post-polish thickness. Machine-accessible software to perform such methods are also disclosed as are systems in which such methods may be implemented.

20 Claims, 5 Drawing Sheets

WAFER POLISHING CONTROL

BACKGROUND

1. Field

One or more embodiments of the invention relate to the field of manufacturing integrated circuits. In particular, one or more embodiments of the invention relate to the field of polishing wafers.

2. Background Information

Polishing is a well-known process that is commonly used in the manufacture of microprocessors and other integrated circuits. The polishing may be used to remove material from the surface of a wafer or other substrate in order to reduce roughness, planarize the surface, and/or reduce the thickness of the substrate. A common type of polishing presently in widespread use is chemical mechanical polishing (CMP) in which a reactive slurry having a liquid and an abrasive is used for polishing.

It is often proves challenging to consistently control polishing in integrated circuit manufacturing processes. There are various reasons why this may be the case.

One potential reason is that the polishing rate may tend to change or drift over time do to degradation or other modification of the abrasive or other polishing material. As a result, wafers polished at different times in the abrasive lifecycle may experience different polishing rates.

Another potential reason is that the different polishing heads on a polishing tool, and/or among different polishing tools, may have different polishing rates. As a result, wafers polished with different heads and/or tools may experience different polish rates.

Yet another potential reason is that the pre-polish thickness of layers of the starting wafers that are input to the polishing process may vary over time due to variability in material deposition processes that are encountered prior to the polishing process. As a result, wafers polished at different times in the integrated circuit manufacturing process may need different amounts of polishing to achieve the same final thickness.

Each of these sources of variability may tend to lead to variability in the post-polish thickness of layers of the polished wafers if efforts are not taken to control the affect of these variations on the-polishing process. Such variability is generally undesirable.

One prior approach to attempt to control the affect of variation in the thickness of the polished wafers is to use test wafers to determine an appropriate polish time for a polishing tool prior to polishing a wafer lot with the polishing tool. However, there are a number of potential drawbacks to this approach.

One potential drawback is the cost of using dedicated test wafers to calibrate the polishing process. Another potential drawback is the downtime of the polishing process while the test wafers are being polished to determine the appropriate polish time. Yet another potential drawback is the time and cost to use technicians to make decisions about the appropriate polish time for each wafer lot based on the polishing of the test wafers. A further potential drawback is that due, at least in part, to the drawbacks described above, all of the multiple different polishing heads are typically not tested separately with dedicated test wafers. Instead a single polishing time is generally used to represent multiple different polishing heads. This may not adequately take into account head-to-head variation in polishing rates.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 1:
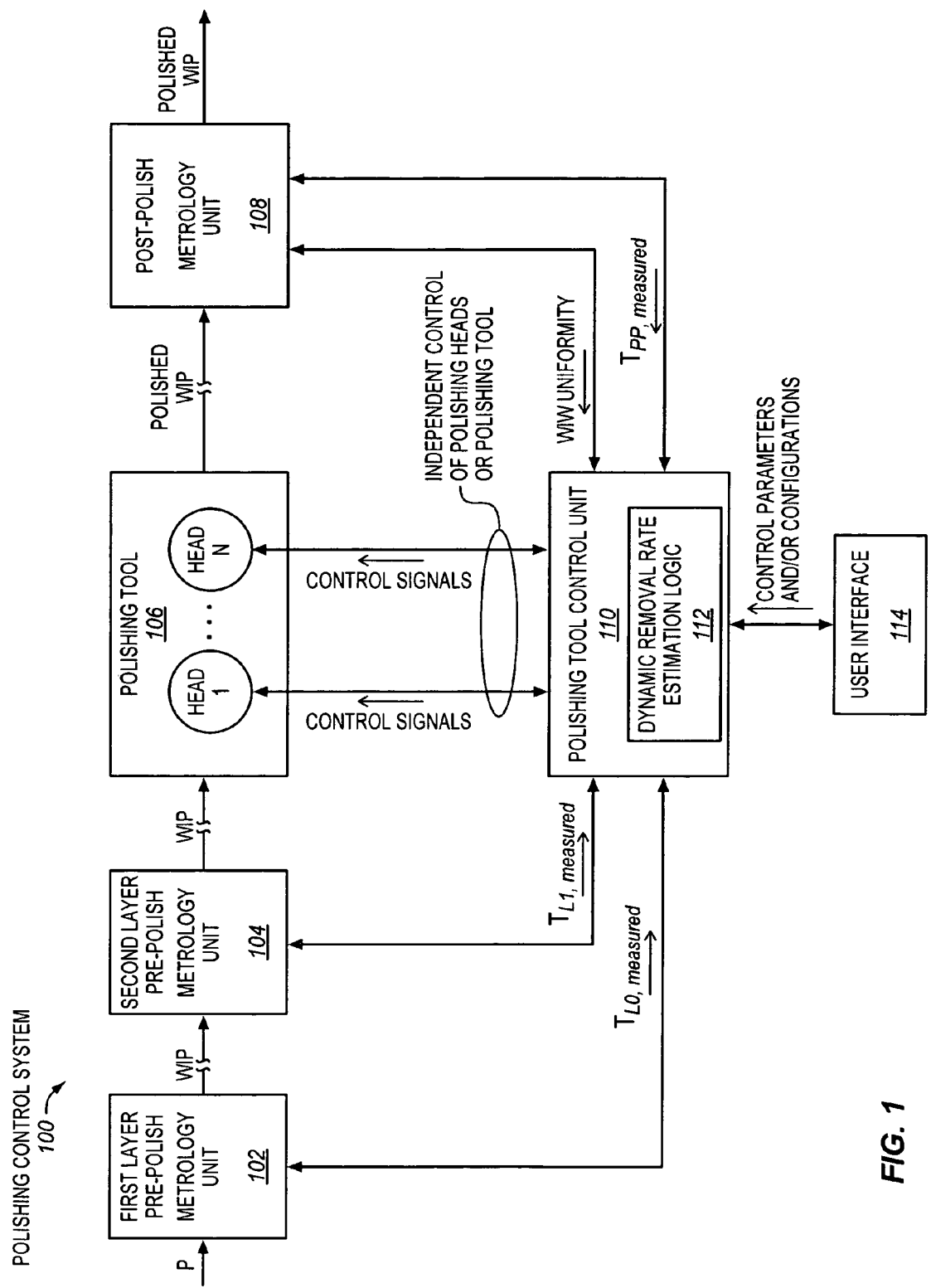
FIG. 1 is a block diagram of a polishing control system, according to one or more embodiments of the invention.

FIG. 1 is a block diagram of a polishing control system 100, according to one or more embodiments of the invention. The polishing control system includes a first layer pre-polish metrology unit 102, a second layer pre-polish metrology unit 104, a polishing tool 106, a post-polish layer metrology unit 108, a polishing tool control unit 110, and a user interface 114.

The first layer pre-polish metrology unit 102 may receive a wafer-in-process (WIP) from an integrated circuit manufacturing process. The WIP may have a so-called first layer ($L_0$), such as, for example, a dielectric layer, deposited or otherwise formed thereon. The first layer pre-polish metrology unit may measure a thickness of the first layer ($T_{L0,measured}$). The first layer pre-polish metrology unit is coupled with or otherwise in communication with the polishing tool control unit 110.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate, interact, or communicate with each other. For example components may be coupled with one another through intervening wires, cables, or other signal paths.

The first layer pre-polish metrology unit may communicate the measured thickness of the first layer ($T_{L0,measured}$) to the polishing tool control unit as a feed-forward control signal. As will be explained in further detail below, the feed-forward control signal may allow the polishing tool control unit to attempt to compensate for a disturbance, such as, for example, a change in deposited thickness of a layer, before the disturbance affects an output of the polishing tool.

Then, the WIP may return to the integrated circuit manufacturing process. At some point, but not necessarily consecutively, a second layer ($L_1$) may be deposited or otherwise formed on the wafer. The second layer ($L_1$) may include the same material as the first layer ($L_0$) or a different material.

A WIP having the second layer (L1) may be provided to the second layer pre-polish metrology unit 104. In the illustrated embodiment, different metrology units, and potentially different types of metrology units, are optionally used to measure the thickness of the first and the second layers, although the scope of the invention is not limited in this respect. In an alternate embodiment, the same metrology unit and/or the same type of metrology unit may optionally be used to measure the thicknesses of the first and second layers. In one or more embodiments of the invention, the one or more metrology units may be physically separate from or non-integrated with the polishing tool, although the scope of the invention is not limited in this respect.

The second layer pre-polish metrology unit may measure a thickness of the second layer ($T_{L1,measured}$). The second layer pre-polish metrology unit is in communication with the polishing tool control unit 110 and may provide the measured thickness of the second layer ($T_{L1,measured}$) to the polishing tool control unit as a feed-forward control signal. It is to be appreciated that measuring the thicknesses of multiple layers and providing the multiple measured thicknesses to the polishing tool control unit is optional and not required. In one or more alternate embodiments of the invention, a thickness of a single layer may optionally be measured and provided to the polishing tool control unit.

Then, the WIP may return to the integrated circuit manufacturing process. At some point, but not necessarily consecutively afterwards, the WIP may be provided to the polishing tool 106. The polishing tool may polish the WIP under the control of the polishing tool control unit. Suitable polishing parameters that may optionally be controlled by the polishing tool control unit include, but are not limited to, polish time, polish pressure, slurry flow, rotational speed of the polishing heads and/or platens, and the like, and combinations thereof. Further details about the control of the polishing unit will be provided below.

After the WIP has been polished by the polishing tool, but not necessarily consecutively afterwards, the polished WIP may be provided to the post-polish metrology unit 108. In one or more embodiments of the invention, the post-polish metrology unit may be part of the polishing tool, although the scope of the invention is not limited in this respect. In another embodiment of the invention it may be a non-integrated or discrete metrology unit. The post polish metrology unit may receive the polished WIP and may measure a post-polish thickness of a layer. In one or more embodiments of the invention, all of the second layer (L1) and a portion of the first layer (L0) may have been removed during polishing. In such embodiments, the post-polish metrology unit may measure a remaining post-polish thickness of the first layer. However, the scope of the invention is not limited in this respect. In one or more alternate embodiments the control system may be configurable to allow a portion of a single layer may be polished away and a thickness of a remaining portion of that single layer may be measured. The post-polish metrology unit is in communication with the polishing tool control unit and may provide the measured post-polish thickness of the layer (Tpp,measured) to the polishing tool control unit as a feedback control signal. As will be explained in further detail below, a feed-back control signal may be used by the polishing tool control unit to attempt to modify operation of the polishing tool based on an output of the polishing tool, such as, for example, a measured post-polish thickness.

As shown, in one or more embodiments of the invention, the post-polish metrology unit may also optionally measure within-wafer (WIW) uniformity or non-uniformity. The post-polish metrology unit may provide the WIW uniformity or non-uniformity information to the polishing tool control unit as a feed-back control signal so that the polishing tool control unit may control polishing to control and/or improve WIW uniformity.

Accordingly, as shown in the illustrated embodiment, the polishing tool control unit may receive the measured thickness of the first layer ($T_{L0,measured}$), the measured thickness of the second layer ($T_{L1,measured}$), the measured post-polish thickness of the layer ($T_{pp,measured}$), and the WIW uniformity or non-uniformity metric or information. In other embodiments of the invention, the polishing tool control unit a subset of such information, or a superset of such information, including potentially different information entirely.

The polishing tool control unit may also receive control parameters and/or configuration information from a user through the user interface 114. Suitable control parameters and/or control configuration information include, but are not limited to, targets, setpoints, control values, constants, offsets, gains, filtering information, unmeasured disturbances, and the like, and combinations thereof.

The polishing tool control unit may include logic to control the operation of the polishing tool based, at least in part, on information received from the components of the polishing control system. Suitable logic includes, but is not limited to, circuits and other hardware, sequences of machine-accessible instructions and other software, and combinations of software and hardware.

In one or more embodiments of the invention, the polishing tool control unit may control the polishing tool based, at least in part, on feed-forward control using one or more, or multiple, pre-polish thickness measurements made on one or more metrology units. For example, the pre-polish thickness measurements may be used to estimate polish times, as will be explained in further detail below. It is contemplated that this may potentially help to account for variation in the pre-polish thickness of layers due to such factors as variability in preceding material deposition processes.

In one or more embodiments of the invention, the polishing tool control unit may control the polishing tool based, at least in part, on feed-back control using a post-polish measured thickness made on a metrology unit. For example, as shown, in one or more embodiments of the invention, the polishing tool control unit may include dynamic material removal rate estimation logic 112 to dynamically and in real-time estimate the material removal rate of one or more layers of a wafer just polished based, at least in part, on the feed-back post-polish thickness measurement for the wafer. It is contemplated that such real-time calculation of the material removal rate may help to account for drifts or other changes in the polishing rate that may tend to occur over time due to such factors as degradation or other modification of the abrasive or other polishing material.

In one or more embodiments of the invention, the polishing tool control unit may control different polishing heads of the polishing tool differently, separately, and/or independently. As shown, in one or more embodiments of the invention, the polishing tool may include multiple polishing heads. In particular, the polishing tool may include a HEAD 1, a HEAD N, and optionally other polishing heads. In one or more embodiments of the invention, different, separate, or independent control signals may optionally be provided to the different polishing heads in order to provide different control to the different heads. It is contemplated that this may potentially help to account for polishing rate differences between the different polishing heads on a polishing tool or among polishing tools.

Figure 2:
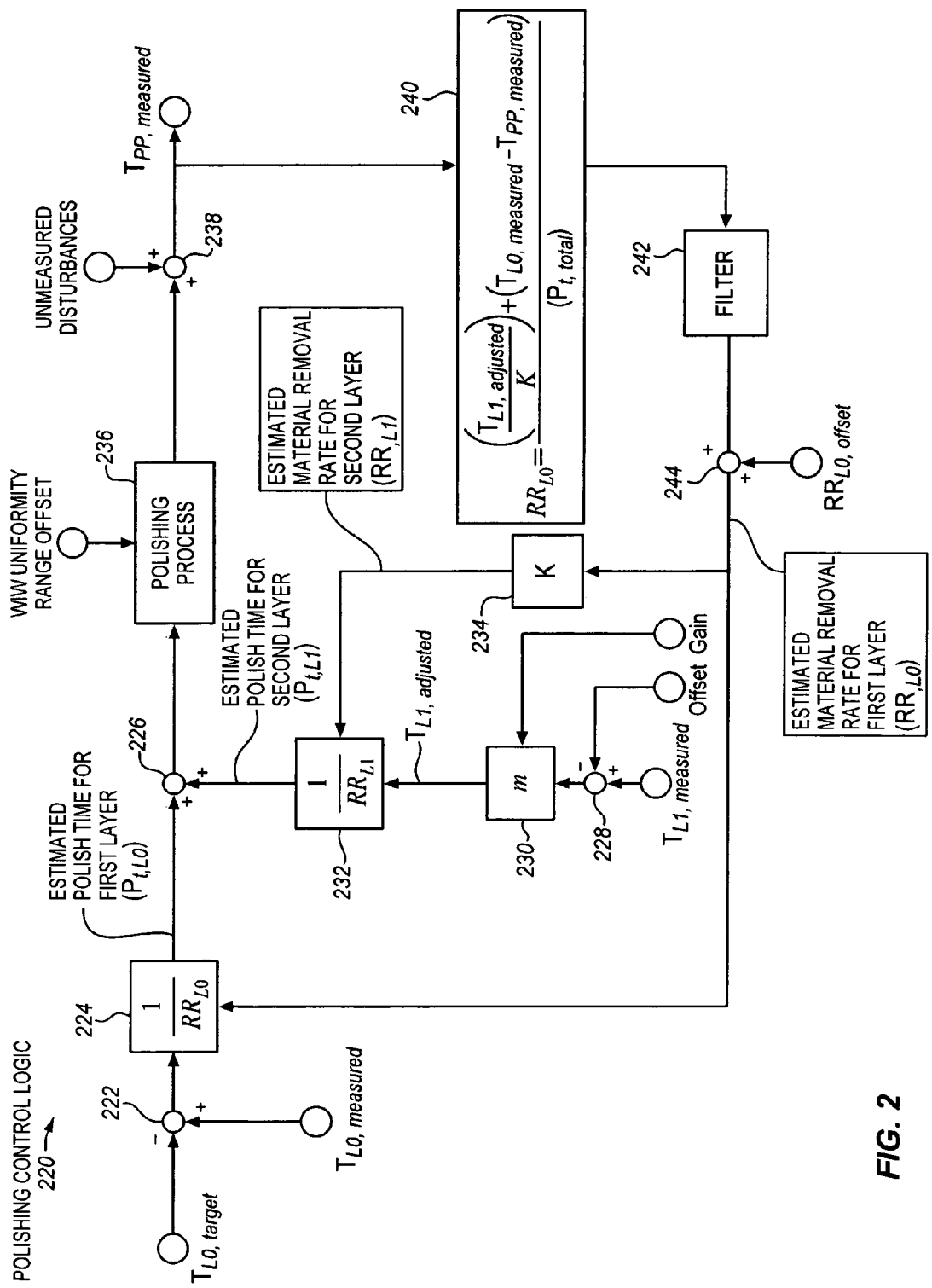
FIG. 2 is a process control diagram that represents suitable polishing control logic that may be used by a polishing tool control unit to control a polishing tool in an integrated circuit manufacturing process, according to one or more embodiments of the invention.

FIG. 2 is a process control diagram that represents suitable polishing control logic 220 that may be used by a polishing tool control unit to control a polishing tool in an integrated circuit manufacturing process, according to one or more embodiments of the invention. In one or more embodiments of the invention, the polishing control logic may be used to control a single polishing head differently, separately, and/or independently of the control of other polishing heads.

After deposition of a first layer ($L_0$) over a wafer, a first metrology unit may be used to measure a thickness of the first layer ($T_{L0,measured}$). It is contemplated that such measurement of starting thicknesses of layers may potentially help to account for variation in the pre-polish thickness of layers due to such factors as variability in preceding material deposition processes.

The control logic may receive the measured thickness of the first layer ($T_{L0,measured}$) as a feed-forward control signal and it may be provided as input to subtraction logic 222. A predetermined target thickness of the first layer ($T_{L0,target}$), which may be predetermined based on the intended design thickness of the first layer, may also be provided as input to the subtraction logic 222. The subtraction logic 222 may subtract the target thickness of the first layer ($T_{L0,target}$) from the measured thickness of the first layer ($T_{L0,measured}$). Other forms of comparison, such as, for example, ratios, differences of squares, or the like, are also suitable.

An output of the subtraction logic 222 may be provided as input to division logic 224. For example, in one aspect, the difference ($T_{L0,measured} - T_{L0,target}$) may be provided to the division logic 224. An estimated material removal rate for the first layer ($RR_{L0}$) may also be provided as input to the division logic 224. As will be explained in further detail below, the estimated material removal rate for the first layer ($RR_{L0}$) may be determined dynamically and in real time based feedforward and feedback layer thickness measurements and other polishing process parameters. The division logic 224 may divide the difference of the measured and target thicknesses of the first layer ($T_{L0,measured} - T_{L0,target}$) by the estimated material removal rate for the first layer ($RR_{L0}$). For example, in one or more embodiments, the division logic may determine the ratio ($T_{L0,measured} - T_{L0,target}$)/($RR_{L0}$), although the scope of the invention is not limited in this respect. This is just one example. Other forms of comparison, such as, for example, weighted ratios, are also suitable. Additionally, it is to be appreciated that in one or more alternate embodiments, the division logic may optionally be replaced by multiplication logic that is configured to multiply the difference of the measured and target thicknesses of the first layer by the reciprocal of the estimated material removal rate. The result determined by the division logic 224 may represent the estimated polish time for the first layer ($P_{t,L0}$).

An output of the division logic 224, which may represent the estimated polish time for the first layer ($P_{t,L0}$), may be provided as input to addition logic 226. The addition logic 226 may also receive as input an estimated polish time for the second overlying layer ($P_{t,L1}$). Before proceeding further, a brief discussion of how the estimated polish time for the second overlying layer ($P_{t,L1}$) may be determined.

Sometime after deposition of the first layer ($L_0$) over the wafer, a second layer ($L_1$) may be deposited over the first layer ($L_0$). Then, a metrology unit may be used to measure a thickness of the second layer ($T_{L1,measured}$). The metrology unit used to measure the thickness of the second layer may be either the same or different than the metrology unit used to measure the thickness of the first layer. Accordingly, different metrology units may potentially be used, in one or more embodiments, to make thickness measurements.

In some cases, different metrology units may potentially measure slightly different thicknesses for a given layer. In one or more embodiments of the invention, this potential variation may be taken into account by using a predetermined relationship between thickness measurements made on different metrology units in order to help improve control. One suitable type of relationship is a linear relationship. For example, a user configurable or otherwise predetermined offset or intercept and a user configurable or otherwise predetermined gain or slope may be used to establish a linear relationship between thickness measurements made on two different metrology units. In one aspect, thicknesses of multiple layers, which may span a relevant range of different thicknesses, may be measured on each of two different metrology units. A linear relationship or other correlation may be established between the measured thicknesses on the two different metrology units, such as, for example, by linear regression, another statistical approach, or by eyeballing a best-fit line or curve. The slope of the linear relationship may represent the gain and the intercept of the linear relationship may represent the offset. The offset may be either positive or negative and the gain may be either greater or less than one. Values of the offset and gain may also optionally be determined by other approaches.

Referring again to FIG. 2, as shown in the illustrated embodiment, the control logic may receive the measured thickness of the second layer ($T_{L1,measured}$) as a feed-forward control signal and it may optionally be adjusted based on such an offset and gain. In particular, the measured thickness of the second layer ($T_{L1,measured}$) may optionally be provided as input to a second subtraction logic 228 along with the user configurable or otherwise predetermined offset. The second subtraction logic 228 may subtract the offset from the measured thickness of the second layer ($T_{L1,measured}$). That is the subtraction logic may determine the result ($T_{L1,measured}$ - offset).

As further shown, the output of the second subtraction logic 228 may be provided as input to a multiplication logic 230 along with the user configurable or otherwise predetermined gain. The multiplication logic 230 may multiply the difference between the measured thickness of the second layer and the offset ($T_{L1,measured}$ - offset) and the gain. That is the multiplication logic 230 may determine a result (gain)($T_{L1,measured}$ - offset) which may represent an adjusted thickness of the second layer ($T_{L1,adjusted}$).

This is just one of many possible ways in which a measured thickness may be adjusted. Non-linear relationships are also suitable. For example, in one or more other embodiments of the invention, a constant offset alone may optionally be used. As other examples, in one or more embodiments of the invention, curved, exponential, parabolic, or other non-linear relationships may optionally be used.

Furthermore, although such relationships may potentially help to improve control by reducing variation in the input measurements, the use of such relationships is not required.

For example, the same metrology unit may optionally be used to make measurements or differences between measurements made on different metrology units may optionally be assumed to be negligible or ignored.

The adjusted thickness of the second layer ($T_{L1,adjusted}$) may be provided as input to a second division logic 232. An estimated material removal rate for the second layer ($RR_{L1}$) may also be provided as input to the second division logic 232.

As shown in the illustrated embodiment, the estimated material removal rate for the second layer ($RR_{L1}$) may represent an output of a second multiplication logic 234. The second multiplication logic 234 may receive as an input the aforementioned estimated material removal rate for the first layer ($RR_{L0}$). The second multiplication logic 234 may have, or may receive as input, a multiplication constant (K). The multiplication constant (K) may include a predetermined and/or user configurable value that may represent a ratio between the removal rates of the second and first layers, respectively. That is, the multiplication constant (K) may represent the ratio ($RR_{L1}/RR_{L0}$). The multiplication constant (K) may be determined experimentally and/or statistically. The second multiplication logic 234 may multiply the estimated material removal rate for the first layer ($RR_{L0}$) by the multiplication constant (K) representing the ratio ($RR_{L1}/RR_{L0}$) in order to estimate the material removal rate for the second layer ($RR_{L1}$). The second multiplication logic 234 may provide the estimated material removal rate for the second layer ($RR_{L1}$) to the second division logic 232.

The second division logic 232 may receive the adjusted thickness of the second layer ($T_{L1,adjusted}$) and the estimated material removal rate for the second layer ($RR_{L1}$). In one or more embodiments of the invention, the second division logic 232 may divide the adjusted thickness of the second layer ($T_{L1,adjusted}$) by the estimated material removal rate for the second layer ($RR_{L1}$). For example, the second division logic may determine the ratio ($T_{L1,adjusted}$)/($RR_{L1}$), although the scope of the invention is not limited in this respect. This is just one example. Other forms of comparison, such as, for example, weighted ratios, are also suitable. Additionally, it is to be appreciated that in one or more alternate embodiments, the second division logic 232 may optionally be replaced by multiplication logic that is configured to multiply the adjusted thickness of the second layer by the reciprocal of the estimated material removal rate of the second layer. The result determined by the second division logic 232 may represent the estimated polish time for the second layer ($P_{t,L1}$).

The output of the second division logic 232, which may represent the estimated polish time for the second layer ($P_{t,L1}$), may be provided as input to the addition logic 226, along with the output of the division logic 224, which may represent the estimated polish time for the second layer ($P_{t,L0}$). The addition logic 226 may add or otherwise combine the estimated polish times for the first and second layers. For example, in one or more embodiments of the invention, the addition logic may determine a result ($P_{t,L0} + P_{t,L1}$) representing the estimated total polish time ($P_{t,total}$), although the scope of the invention is not limited in this respect. Other forms of combination, such as, for example, weighted sums, adjusted sums, sums of squares, and the like, are also suitable.

The result determined by the addition logic 226 may be provided as input to a polishing process 236 in order to at least partially control a polishing time of the polishing process 236. As shown, the polishing process 236 may also optionally receive as input a within-wafer (WIW) range offset that may be used to control polishing by the polishing process. As will be explained in further detail below, in one or more embodiments of the invention, the WIW range offset may be used to control portions of the polishing time on different platens of the polishing process, although the scope of the invention is not limited in this respect.

A wafer may be polished by the polishing process based, at least in part, on the estimated total polish time ($P_{t,total}$) and potentially the WIW range offset. After the wafer has been polished, in one or more embodiments of the invention, the actual total polish time used to polish the wafer may optionally be provided from the polishing process as input to a second addition logic 238 along with an unmeasured disturbances metric, although this is not required. The unmeasured disturbances metric may optionally be used to account for sources of process variation that are not otherwise accounted for in the control system that may otherwise affect the outcome of the polish. The second addition logic may add or otherwise combine the actual total polish time and the unmeasured disturbances.

In one or more embodiments of the invention, a post-polish thickness of the polished wafer may optionally be measured and used to help control polishing. For example, as shown in the illustrated embodiment of the invention, a measured post-polish thickness ($T_{pp,measured}$) may be received by the control logic as a feed-back control signal and it may be provided to a first layer material removal rate dynamic estimation logic 240. The first layer material removal rate estimation logic 240 may estimate a material removal rate for the first layer. In one or more embodiments of the invention, the first layer material removal rate estimation logic 240 may estimate the material removal rate for the first layer according to the following equation:

$$RR_{L0} = \frac{\left(\frac{T_{L1,adjusted}}{K}\right) + (T_{L0,measured} - T_{pp,measured})}{P_{t,total}}$$

In this equation, $RR_{L0}$ represents the estimated removal rate for the first layer, $T_{L1,\ adjusted}$ represents the adjusted thickness of the second layer of the wafer just polished, $T_{L0,\ measured}$ represents the measured thickness of the first layer of the wafer just polished, $T_{pp,measured}$ represents the measured post-polish thickness of the wafer just polished, K is a constant representing the assumed ratio of the removal rate of the second layer to the removal rate of the first layer ($RR_{L1}/RR_{L0}$), and $P_{t,total}$ represents the total estimated polish time of the wafer just polished. This is just one of many possible equations that may be used to estimate the removal rate. Many other equations are also suitable. It is contemplated that such dynamic and real-time calculation of the material removal rate may help to account for drifts or other changes in the polishing rate that may tend to occur over time due to such factors as degradation or other modification of the abrasive or other polishing material.

The estimated material removal rate for the first layer may be provided to a filter logic 242. The filter logic may receive the estimated material removal rate. In one or more embodiments of the invention, the filter logic may include an exponentially weighted moving average (EWMA) filter, although the scope of the invention is not limited in this respect. The EWMA filter may help to dampen or temper change to the estimated first layer material removal rate, which may also affect the estimated second layer material removal rate, based at least in part on previous estimated first layer material removal rates or history in order to avoid over control. Other filter logics are also suitable, such as, for example, one based on linear exponential smoothing, one based on damped-trend linear-exponential smoothing, one based on double exponential smoothing filters, or the like, or combinations thereof. Still further, in one or more embodiments of the invention, change to the previous estimate may optionally not be made unless the new estimate differs from the previous estimate by more than a configurable or otherwise predetermined threshold and an alarm may optionally be provided to be triggerable if the difference is greater than another user configurable or otherwise predetermined threshold.

The output of the filter logic may be provided to a third addition logic 244 along with a user configurable first layer material removal rate offset ($RR_{L0,offset}$). The user configurable first layer material removal rate offset ($RR_{L0,offset}$) may be used for predictive control based on the amount of material processed. For example, in one or more embodiments of the invention, it may represent a counter, or incrementer, or decrementer, to adjust the estimated removal rate based, at least in part, on the number of wafers polished and/or the number of lots polished. The amount of adjustment may be configurable and predetermined and may be determined empirically. The output of the third addition logic 244 may represent the estimated first layer material removal rate. As previously discussed, this estimated first layer material removal rate may be provided to the division logic 224 and to the second multiplication logic 234.

The approach described above may be substantially repeated for the next lot of wafers to be polished and/or for the next wafer to be polished by the particular polishing head represented by the control illustrated.

In one or more embodiments of the invention, the passage of time and/or the number of wafers or lots polished may optionally be monitored by the polishing tool control unit. In one aspect, a counter may be incremented for every wafer polished or lot of wafers polished. In one or more embodiments of the invention, the polishing tool control unit may use one or more of such monitored parameters in order to infer when data may be stale or outdated. For example, if the time elapsed and/or the total number of wafers processed since a material removal rate was determined from a test wafer is sufficiently great or surpasses a user configurable threshold, then the determined material removal rate may optionally be inferred to be stale or outdated. As another example, if the time elapsed and/or the total number of wafers processed since a material removal rate was estimated dynamically by equation using measured thicknesses and polishing times is sufficiently great or surpasses a user configurable threshold, then the estimated material removal rate may optionally be inferred to be stale or outdated. In such cases, alarms to users may optionally be provided.

Figure 3:
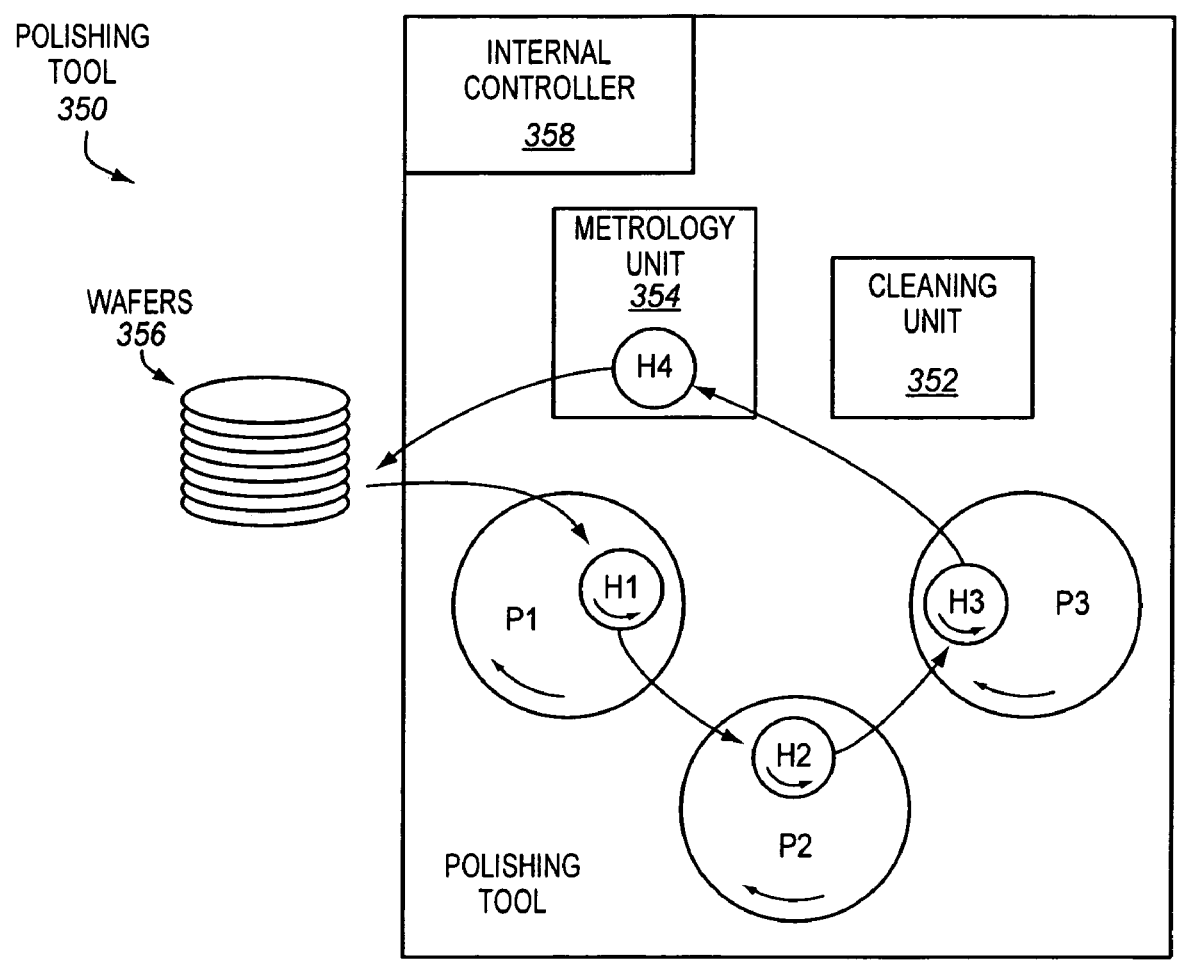
FIG. 3 is a block diagram showing an exemplary polishing tool that is suitable for one or more embodiments of the invention.

FIG. 3 is a block diagram showing an exemplary polishing tool 350 that is suitable for one or more embodiments of the invention. The illustrated polishing tool includes a first platen (P1), a second platen (P2), and a third platen (P3), although the scope of the invention is not limited in this respect. The illustrated polishing tool also includes an integrated cleaning unit 352 and an integrated metrology unit 354.

Wafers 356 may be polished on the polishing tool. In particular, a wafer may be assigned to a corresponding polishing head and the wafer may travel with the polishing head across the first platen (P1), the second platen (P2), the third platen (P3), and on to the integrated metrology unit for a post-polish thickness measurement, before the wafer is removed from the polishing tool. The integrated cleaning unit may optionally be used to clean the wafer when appropriate. In the illustrated embodiment, a snapshot of polishing is taken in which a first wafer assigned to a first head (H1) is shown being polished by the first platen (P1), a second wafer assigned to a second head (H2) is shown being polished by the second platen (P2), a third wafer assigned to a third head (H3) is shown being polished by the third platen (P3), and a fourth wafer assigned to a fourth head (H4) is shown having a thickness measurement being made thereon by the integrated metrology unit.

The illustrated polishing tool also includes an integrated or internal controller 358. In one or more embodiments of the invention, the internal control may be capable of autonomously adjusting polishing by the polishing tool. For example, in one or more embodiments of the invention, the integrated or internal controller of the polishing tool may be capable of controlling or otherwise adjusting a total block of time allocated across the different platens based on wafer-level feedback from the internal metrology unit.

In one or more embodiments of the invention, it is contemplated that control provided by an external or non-integrated polishing tool control unit may cooperate with the integrated or internal controller to control polishing by the polishing tool. In one or more embodiments of the invention, total polish times per head may be divided into "main" polish times and "delta" polish times on each of the first, second, and third platens. The main polish times may include user configurable proportions of the total polish times. Often, the main polish times include majorities of the total polish times, although this is not required. The delta times may optionally include hidden times that may represent an optional fixed offset that makes up for a difference in rate from one platen to another. Such hidden times are optional and not required.

Figure 4:
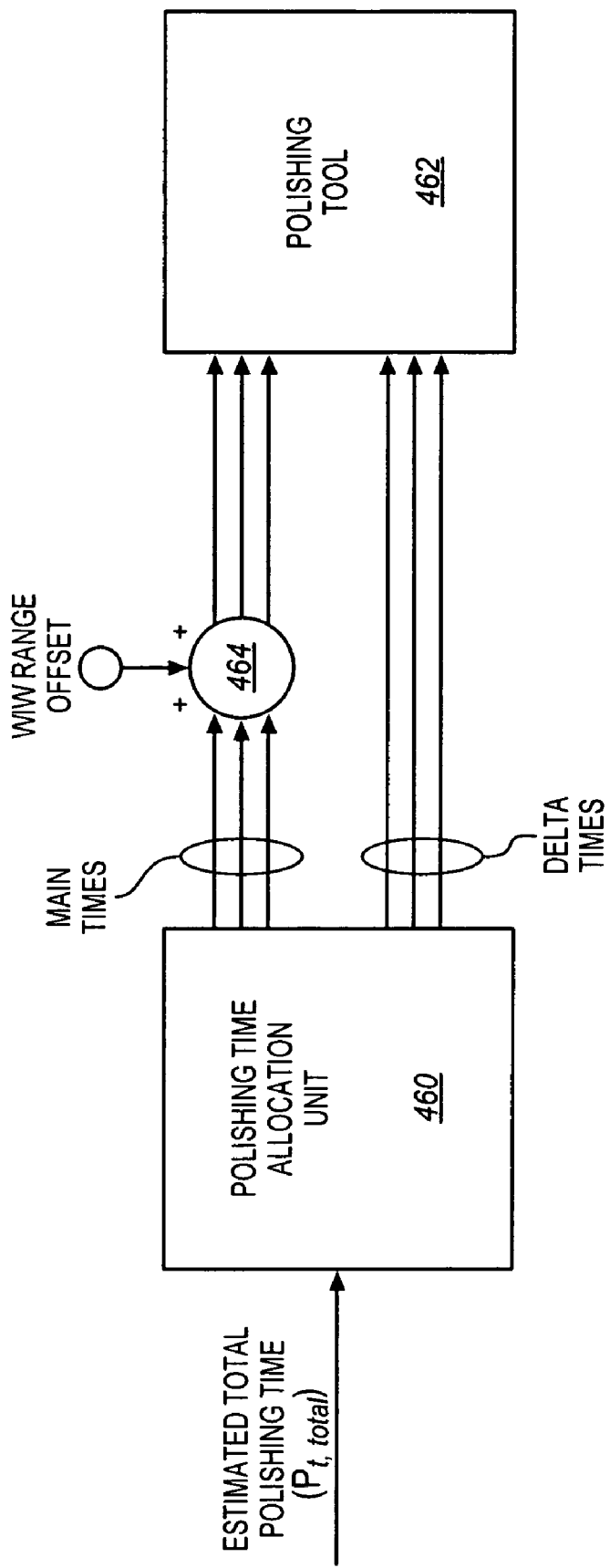
FIG. 4 is a block diagram showing a polishing time allocation unit that may be used to allocate polishing times for a polishing tool, according to one or more embodiments of the invention.

FIG. 4 is a block diagram showing a polishing time allocation unit 460 that may be used to allocate polishing times for a polishing tool 462, according to one or more embodiments of the invention. The polishing time allocation unit may receive an estimated total polish time ($P_{t,total}$). The polishing time allocation unit may allocate the estimated total polish time among main times and delta times. The polishing time allocation unit may also allocate the main times among platens and the delta times among platens. The polishing time allocation unit is coupled with, or otherwise in communication with, the polishing tool, and may provide allocated polish times to the polishing tool.

Figure 5:
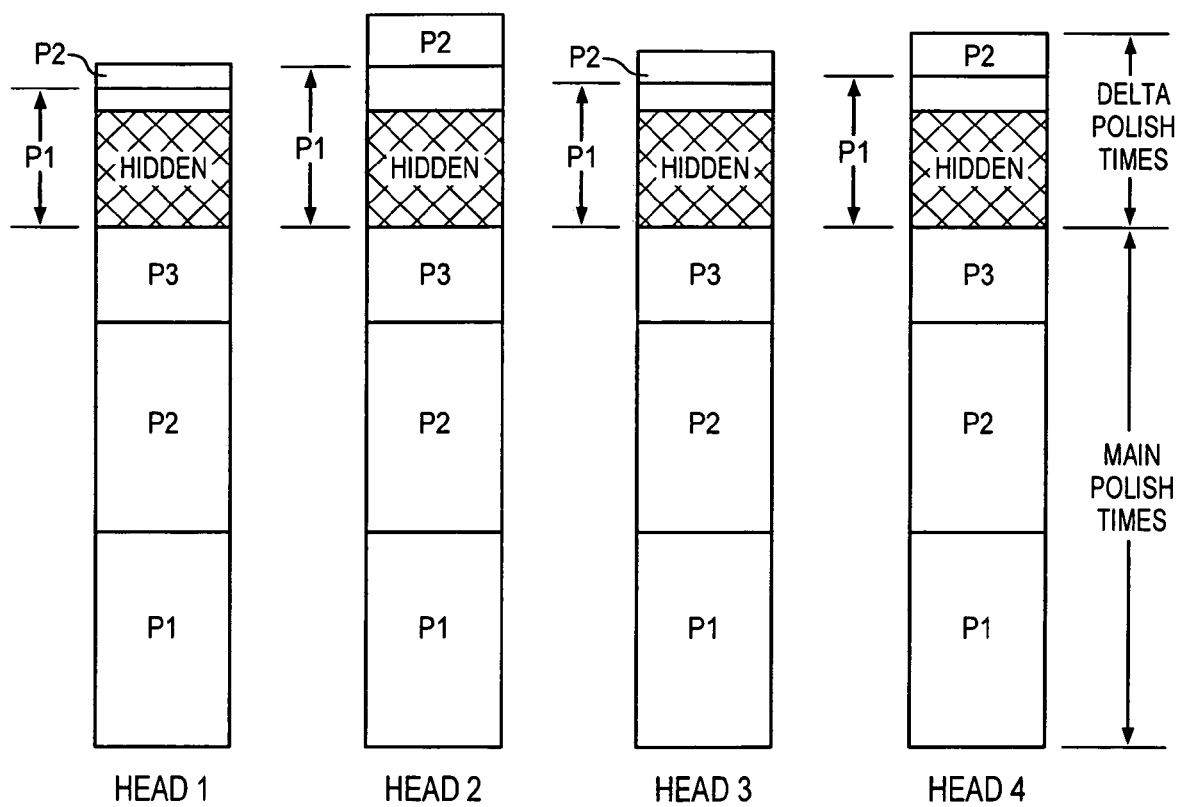
FIG. 5 shows an exemplary allocation of polishing times, according to one or more embodiments of the invention.

FIG. 5 shows an exemplary allocation of polishing times that is suitable for a polishing tool, according to one or more embodiments of the invention. Polish times are provided for each of four heads (head 1, head 2, head 3, and head 4). As shown, the polish times for each of the heads are divided into main polish times and delta polish times. Each of the main polish times and delta polish times is divided among three platens (P1, P2, and P3).

Notice that the total main time per head is the same for all heads. The total main time may be controlled or otherwise adjusted by the internal controller of the polishing tool. The integrated controller of the tool may make polish time adjustments based on wafer-level feedback. The splits of the total main time per head among platens is the same for each of the heads and may be controlled or otherwise adjusted by the external polishing tool control unit, such as, for example, based on predetermined configurable percentages set in the control logic.

Notice also that the hidden times are the same for all heads. The non-hidden portions of the delta times vary from head to head. The total of the non-hidden portions of the delta times may be controlled or otherwise adjusted by the external polishing tool control unit and may not be controlled or otherwise adjusted by the internal controller of the polishing tool. The split of the non-hidden portion of the delta times may be configured by the external polishing tool control unit and may vary from head-to-head.

The polishing time allocation unit may optionally include logic to perform one or more checks and optionally to provide one or more alarms. For example, a check may optionally be included to ensure that the sum of the configured main polish time allocations is less than 100% so that some time is remaining for delta polish times. As another example, a check may optionally be included to ensure the sum of the main polish times and the configured delta polish times allocations is equal to 100% so all remaining time is allocated. As yet another example, a check may optionally be provided to compare the total polish time for each head against the prior recommended polish time for the head for maximum adjustment condition and dead-band conditioning and to ensure that it is greater than the configured hidden time on each platen. Alarms may optionally be provided based on the results of the checks.

Referring again to FIG. 4, as shown, adjustment logic 464 may optionally be included to increase or decrease the main times based on WIW uniformity range information, in one or more embodiments of the invention. In one or more embodiments of the invention, if the WIW non-uniformity is outside of a predetermined user configurable range, then the polish time may optionally be adjusted in order to help control the WIW non-uniformity so that it is within the range. For example, if the non-uniformity is outside of the range and there is too much WIW non-uniformity, then, in some polishing processes, polishing time may be decreased slightly by a predetermined amount. Alternatively, in other polishing processes, polishing time may be increased slightly by a predetermined amount. This may depend upon the particular implementation and whether polishing tends to increase or decrease the WIW uniformity.

Controlling a polishing tool or process as disclosed herein may offer certain potential advantages. One potential advantage is reduced variation in post-polish thickness. Another potential advantage is reduced variation in post-polish WIW non-uniformity. Yet another potential advantage is ability to better account for head-to-head variation and/or consumable wear on the polishing process. A still further potential advantage is a reduction in the number of test wafers used to determine how to polish wafers. This may offer potential advantages in itself, such as, for example, potential reduction in test wafer costs, potential reduction in technician involvement in determining polishing times, and potentially decreased tool downtime. It is to be understood that the scope of the invention is not limited to achieving any one or more or all of these advantages.

In the description above, for the purposes of explanation, numerous specific details have been set forth in order to provide a thorough understanding of the embodiments of the invention. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known circuits, structures, devices, and operations have been shown in block diagram form or without detail in order to avoid obscuring the understanding of the description.

It will also be appreciated, by one skilled in the art, that modifications may be made to the embodiments disclosed herein, such as, for example, to the configurations, functions, and manner of operation of the components of the embodiments. All equivalent relationships to those illustrated in the drawings and described in the specification are encompassed within embodiments of the invention.

Various operations and methods have been described. Some of the methods have been described in a basic form, but operations may optionally be added to and/or removed from the methods. The operations of the methods may also often optionally be performed in different order. Many modifications and adaptations may be made to the methods and are contemplated.

Certain operations may be performed by hardware components, or may be embodied in machine-executable instructions, that may be used to cause, or at least result in, a circuit programmed with the instructions performing the operations. The circuit may include a general-purpose or special-purpose processor, or logic circuit, to name just a few examples. The operations may also optionally be performed by a combination of hardware and software.

One or more embodiments of the invention may be provided as a program product or other article of manufacture that may include a machine-accessible and/or readable medium having stored thereon one or more instructions and/or data structures. The medium may provide instructions, which, if executed by a machine, may result in and/or cause the machine to perform one or more of the operations or methods disclosed herein. Suitable machines include, but are not limited to, computer systems, process controllers, manufacturing tools, polishing tools, metrology units, and a wide variety of other devices with one or more processors, to name just a few examples.

The medium may include, a mechanism that provides, for example stores information in a form that is accessible by the machine. For example, the medium may optionally include recordable mediums, such as, for example, floppy diskette, optical storage medium, optical disk, CD-ROM, magnetic disk, magneto-optical disk, read only memory (ROM), programmable ROM (PROM), erasable-and-programmable ROM (EPROM), electrically-erasable-and-programmable ROM (EEPROM), random access memory (RAM), static-RAM (SRAM), dynamic-RAM (DRAM), Flash memory, and combinations thereof.

For clarity, in the claims, any element that does not explicitly state "means for" performing a specified function, or "step for" performing a specified function, is not to be interpreted as a "means" or "step" clause as specified in 35 U.S.C. Section 112, Paragraph 6. In particular, any potential use of "step of" in the claims herein is not intended to invoke the provisions of 35 U.S.C. Section 112, Paragraph 6.

It should also be appreciated that reference throughout this specification to "one embodiment", "an embodiment", or "one or more embodiments", for example, means that a particular feature may be included in the practice of the invention. Similarly, it should be appreciated that in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

Accordingly, while the invention has been thoroughly described in terms of several embodiments, those skilled in the art will recognize that the invention is not limited to the particular embodiments described, but may be practiced with modification and alteration within the spirit and scope of the appended claims. The description is thus to be regarded as illustrative instead of limiting.

What is claimed is:

1. A method comprising:
measuring one or more pre-polish thicknesses of one or more layers of a wafer;
polishing the one or more layers by moving the wafer across a plurality of platens with a head to which the wafer is assigned;
measuring a post-polish thickness of a layer of the wafer;
controlling polishing by using feed-forward control with the one or more pre-polish thicknesses and by using feed-back control with the post-polish thickness,
wherein controlling the polishing includes controlling allocation of a total polish time for the wafer across the plurality of platens,
including allocating different times to the platens to compensate for differences in material removal rates for the plurality of platens.

2. The method of claim 1, wherein the head is controlled separately from other heads.

3. The method of claim 1, wherein said controlling comprises dynamically calculating a material removal rate based, at least in part, on the one or more pre-polish thicknesses and the post-polish thickness.

4. The method of claim 3. further comprising mathematically filtering the dynamically calculated material removal rate.

5. The method of claim 1, wherein said controlling said polishing by using feed-forward control with the one or more measured pre-polish thicknesses comprises controlling said polishing by using feed-forward control with a plurality of measured pre-polish thicknesses.

6. The method of claim 5, further comprising adjusting one of the plurality of measured pre-polish thicknesses with a predetermined relationship to account for measurement variations between metrology units used to measure the plurality of pre-polish thicknesses.

7. The method of claim 1, wherein said measuring comprises measuring at least one of the one or more pre-polish thicknesses on a metrology unit that is not a part of a polishing tool that is used to polish the wafer.

8. The method of claim 1, further comprising measuring post-polish within-wafer non-uniformity of the layer of the wafer, and wherein said controlling comprises controlling said polishing by using feed-back control with the measured within-wafer non-uniformity.

9. An article of manufacture comprising:
a machine-accessible medium that provides instructions that when executed result in a machine performing operations including,
receiving a feed-forward signal indicating one or more pre-polish thicknesses of one or more layers of a wafer;
receiving a feed-backsignal indicating a post-polish thickness of a layer of the wafer; and
controlling polishing of the one or more layers of the wafer by using the feed-forward signal indicating the one or more pre-polish thicknesses of the one or more layers of the wafer and by using the feed-back signal indicating the post-polish thickness of the layer of the wafer,
wherein controlling the polishing includes controlling allocation of a total polish time for the wafer across a plurality of platens,
including allocating different times to the platens to account for differeaces in material removal rates for the platens.

10. The article of manufacture of claim 9, wherein the machine-accessible medium further provides instructions that when executed result in the machine performing operations including,
controlling a head on a polishing tool that is used to polish the wafer separately than another head on the polishing tool.

11. The article of manufacture of claim 9, wherein the machine-accessible medium further provides instructions that when executed result in the machine performing operations including,
dynamically calculating a material removal rate based, at least in part, on the one or more pre-polish thicknesses and the post-polish thickness.

12. The article of manufacture of claim 11, wherein the machine-accessible medium further provides instructions that when executed result in the machine performing operations including,
filtering the dynamically calculated material removal rate.

13. The article of manufacture of claim 9, wherein the machine-accessible medium further provides instructions that when executed result in the machine performing operations including,
controlling said polishing by using feed-forward control with a plurality of measured pre-polish thicknesses.

14. The article of manufacture of claim 13, wherein the machine-accessible medium further provides instructions that when executed result in the machine performing operations including,
adjusting one of the plurality of pre-polish thicknesses with a predetermined relationship to account for measurement variations between metrology units used to measure the plurality of pre-polish thicknesses.

15. The article of manufacture of claim 9, wherein the machine-accessible medium further provides instructions that when executed result in the machine performing operations including,
receiving at least one of the one or more pre-polish thicknesses from a metrology unit that is not a part of a polishing tool that is used to polish the wafer.

16. The article of manufacture of claim 9, wherein the machine-accessible medium further provides instructions that when executed result in the machine performing operations including,
receiving a feed-back signal indicating a post-polish within-wafer non-uniformity of the layer of the wafer, and
controlling said polishing by using the feed-back signal indicating the post-polish within-wafer non-uniformity.

17. A method comprising:
receiving one or more feed-forward control signals indicating one or more pre-polish thicknesses of one or more layers of a wafer;
receiving a feed-back control signal indicating a post-polish thickness of a layer of the wafer;

dynamically estimating a material removal rate by using an equation with the one or more pre-polish thicknesses and the post-polish thickness;

estimating one or more polish times by using the estimated material removal rate; and polishing at least one layer of the wafer based, at least in part, on the one or more estimated polish times.

18. The method of claim 17, further comprising independently estimating different material removal rates for different polishing heads of a polishing tool.

19. The method of claim 17, wherein the one or more pre-polish thicknesses comprise a plurality of measured pre-polish thicknesses.

20. The method of claim 19, further comprising adjusting one of the plurality of measured pre-polish thicknesses with a predetermined relationship to account for measurement variations between metrology units.

* * * * *